(12) United States Patent
Barnard et al.

(10) Patent No.: US 7,067,821 B2
(45) Date of Patent: Jun. 27, 2006

(54) FLOOD GUN FOR CHARGE NEUTRALIZATION

(75) Inventors: Bryan Robert Barnard, East Sussex (GB); Alan Rupert Bayly, West Sussex (GB); Michael Hugh Humpherson, Surrey (GB)

(73) Assignee: Thermo Electron Corporation, Waltham, MA (US)

( * ) Notice: Subject to any disclaimer, the term of this patent is extended or adjusted under 35 U.S.C. 154(b) by 0 days.

(21) Appl. No.: 11/071,998

(22) Filed: Mar. 4, 2005

(65) Prior Publication Data

US 2005/0205800 A1    Sep. 22, 2005

(30) Foreign Application Priority Data

Mar. 5, 2004    (GB) .................... 0405091.0

(51) Int. Cl.
  *H01J 37/30*    (2006.01)
  *H01J 49/10*    (2006.01)
(52) U.S. Cl. .................. 250/427; 250/423 R; 250/424; 250/251; 250/492.2; 250/492.21; 250/492.3; 250/396 R
(58) Field of Classification Search ............... None
  See application file for complete search history.

(56) References Cited

U.S. PATENT DOCUMENTS

| 4,680,467 | A | 7/1987 | Bryson, III et al. ........ 250/305 |
| 5,432,345 | A | 7/1995 | Kelly .................. 250/306 |
| 5,990,476 | A | 11/1999 | Larson et al. ............ 250/251 |
| 6,329,650 | B1 * | 12/2001 | Dudnikov ................ 250/251 |
| 6,683,320 | B1 * | 1/2004 | Gerlach et al. .......... 250/494.1 |
| 6,979,822 | B1 * | 12/2005 | Stewart et al. ............ 250/310 |

FOREIGN PATENT DOCUMENTS

| EP | 0 537 961 | 8/1999 |
| JP | 3 026 948 | 2/1991 |

OTHER PUBLICATIONS

Technical note VG022T, "Method for Charge Compensation on Sigma Probe, Theta Probe and Theta 300", Apr. 2003.

(Continued)

*Primary Examiner*—Nikita Wells
(74) *Attorney, Agent, or Firm*—Westman, Champlin & Kelly, P.A.

(57) ABSTRACT

A flood gun 10 for charge neutralization of an analysis region $R_a$ of a sample S downstream of the flood gun, comprising: a first source 30 of electrons; a second source 50 of positively charged particles; and an extraction and focusing assembly 60,64, arranged to: (i) extract a first, electron beam from the first source and focus the first beam to a first flood area $A_e$ at the analysis region; and (ii) extract a second, positive particle beam from the second source and focus the second beam to a second flood area $A_i$ at the analysis region. The electron beam and the positive particle beam may both be extracted and focused simultaneously, in a single mode of operation or, alternately, in a dual mode of operation. A corresponding method of providing charge neutralization and a spectroscopic system for secondary particle emission analysis are disclosed.

36 Claims, 7 Drawing Sheets

OTHER PUBLICATIONS

Larson et al., P. E., J. Vac. Sci. Technol. A 16 (6), "Surface charge neutralization of insulating samples in x-ray photomission spectroscopy" pp. 3483-3489, Nov./Dec. 1998.

Harting et al., E., "A Low Convergence Electron Gun for Energies above 2 eV", The Review of Scientific Instruments, vol. 41, No. 1, pp. 97-101, Jan. 1970.

Hunt et al., C. P., "The Surface Analysis of Insulators by SIMS: Charge Neutralization and Stabilization of the Surface Potential" Surface and Interface Analysis, vol. 3, No. 4, pp. 157-160, 1981.

Yu et al, X., "Pressure Dependence of the Charging Effect in Monochromatized Small Spot X-ray Photoelectron Spectroscopy", Journal of Electron Spectroscopy and Related Phenomena, vol. 50, pp. 19-29, 1990.

Yu et al., X., "Some aspects of the charging effect in monochromatized focused XPS", Fresenius J. Anal Chem, pp. 233-236, 1993.

Moulder et al., J. "The PHI Interface", Physical Electronics, vol. 17, No. 1, 1997.

Edgell et al., M. J., "The Use of an Electron Flood Gun When Adopting Monochromatic $AgL\alpha$ Radiation for the XPS Analysis of Insulators", Surface and Interface Analysis, vol. 8, pp. 113-119, 1986.

Bryson, III, C. E., "Surface Potential Control in XPS", Surface Science, pp. 50-58, 1987.

Cazaux et al., J., "Some physical descriptions of the charging effects of insulators under incident particle bombardment", Journal of Electron Spectroscopy and Related Phenomena, vol. 59, pp. 49-71, 1992.

* cited by examiner

FIG. 1 – Prior Art

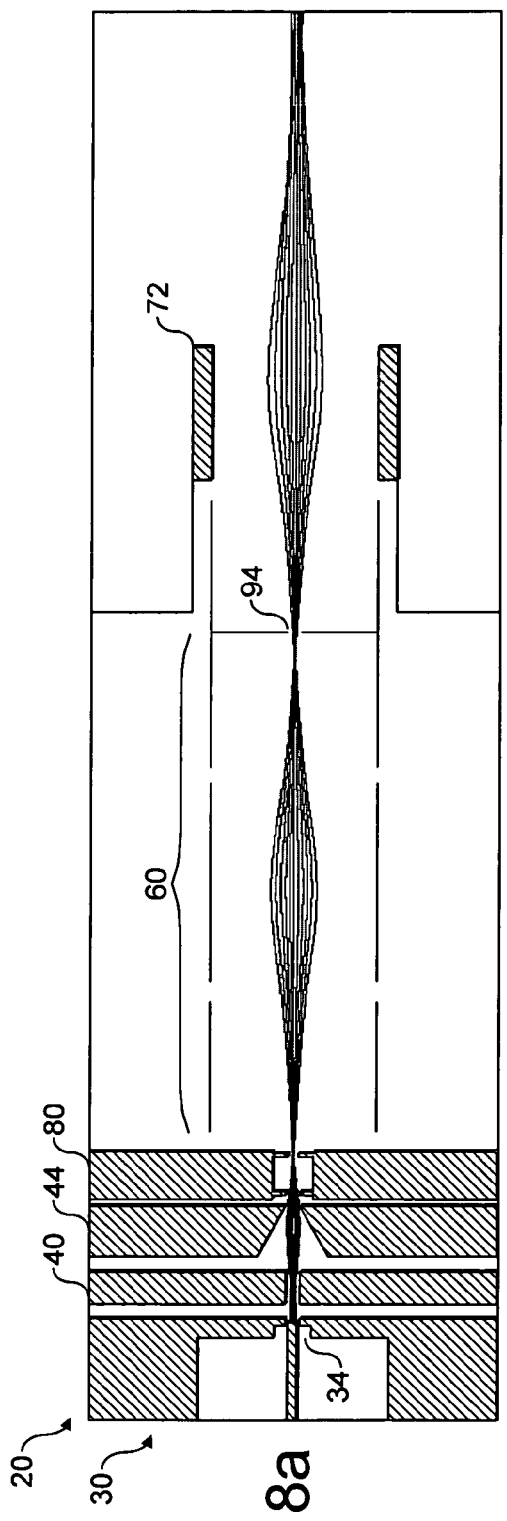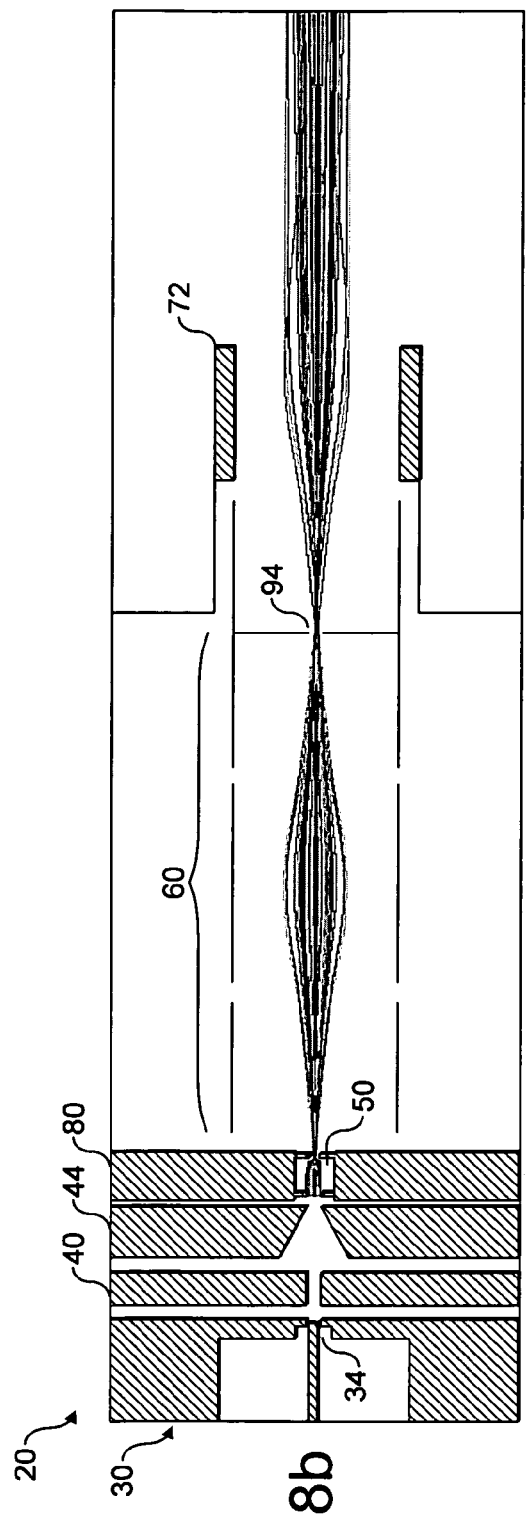

FLOOD GUN FOR CHARGE NEUTRALIZATION

The present application claims priority of United Kingdom patent application Serial No. 0405091.0, filed Mar. 5, 2004, the content of which is hereby incorporated by reference in its entirety.

BACKGROUND OF THE INVENTION

The present invention relates to a flood gun for charge neutralization.

Spectroscopic analysis techniques, such as x-ray photoelectron spectroscopy (XPS), Auger electron spectroscopy (AES), secondary ion mass spectroscopy (SIMS), ultraviolet photoelectron spectroscopy (UPS), among others, are widely used in the elemental and chemical analysis of sample surfaces. In each case, the surface of a sample is bombarded by a beam of charged particles or photons—the primary beam. The composition of the surface may be determined by the accurate and precise measurement of either the energy or the mass of the particles consequently released from the surface of the sample—the secondary particles.

Similarly, in the field of electron microscopy (SEM), the sample is bombarded by a beam of high-energy electrons and the intensity of the low-energy electrons released from the surface is used to generate a topographical image of the sample surface. In x-ray microanalysis (EDX) a measurement of the energy of x-rays emerging from a sample is used to produce an elemental image.

For such determination of the energy or mass of the secondary particles, the electric potential of the surface of the sample needs to be well controlled. For electrically conductive samples, this is achieved by connecting the sample to the system ground potential. However, by definition such a mechanism does not work for an insulating sample (such as an insulator, an electrically isolated conductive sample, a conductive sample with an insulating surface, or a sample including one or more electrically isolated regions) and the surface region under analysis becomes charged to a potential essentially determined by the difference between the flux of charged particles arriving at and leaving the region. The main reason for this is that the insulating sample has insufficient conductivity through the mobility of either electrons or holes to restore the neutrality of the region quickly.

Thus when analysing an insulating sample, the analysis region of the surface may become charged to either a positive or negative potential to an extent that is sufficient to interfere with the primary beam and/or the secondary beam. Such interference may lead to distortions in the measurement of the secondary particles, including shifting, broadening, and asymmetry of spectral lines or peaks, or degraded surface images. It is therefore necessary, when analysing insulating samples, to provide a mechanism for controlling the potential of the analysis region of the surface, to try to maintain the analysis region as closely as possible to its uncharged state. A review of the charging effect problem with insulating samples is given, for example, by Cazaux and Lehuede in "Some physical descriptions of the charging effects of insulators under incident particle bombardment", Journal of Electron Spectroscopy and Related Phenomena, 59 (1992) 49–71. There have been a number of charge neutralisation techniques proposed to address this problem.

Although the analysis region charging effect problem applies to many insulating sample surface analysis techniques, including but not limited to those mentioned above, for the sake of clarity the specific case of XPS analysis will now be discussed. The requirement for charge neutralisation is particularly demanding for XPS analysis, since even a relatively small change in surface potential, for example less than 20 mV, may significantly degrade the measurement quality. In addition, the development of monochromated x-ray sources for XPS analysis has made the use of some form of charge neutralisation mechanism an essential requirement on all modem instruments since there is no longer a yield of electrons from the x-ray source to compensate for sample charging, as is the case with polychromatic x-ray sources. In monochromated XPS analysis, a primary beam of x-ray photons excites the production of secondary electrons from the analysis region of a sample. The secondary electrons generated near the surface of the analysis region escape from the sample, leaving the analysis region positively charged. Early attempts to control this charging used, for example, UV sample irradiation; relatively thin samples; conductive sample coatings; or a beam of low-energy electrons, often termed an electron "flood", which provide charge compensation for the electrons emitted from the sample. This low-energy electron beam is typically generated by thermionic emission from a heated filament, followed by electrostatic focusing, and the device which provides the electron beam is referred to as a "flood gun". See, for example, Edgell et al: "The use of an electron flood gun when adopting monochromatic AgLα radiation for the XPS analysis of insulators", Surface and Interface Analysis (1986), vol. 8, 113–119.

A flood gun is thus used to charge the surface to a negative potential, approximately equivalent to the energy of the incident electrons in the flood. The intention is that a dynamic steady state is set up, in which flood electrons reach the sample surface at a rate equal to that of the photoemitted electrons and any excess flood electrons are reflected from the surface, as a result of the negative charge developed by previous flood electrons. In practice, however, a uniform surface potential is not provided, due to the non-uniform nature of either or both of the electron flood beam and the primary, x-ray beam. In particular, any areas of the sample surface which are not irradiated by x-rays, but receive incident flood electrons, become charged to the potential of the most energetic electrons in the flooding beam and then act to repel further flood electrons which are needed to replace the photoemitted electrons from the analysis region which is irradiated by x-rays. The net negative charge developed around the irradiated, analysis region also effectively defocuses any focused electron beam from the flood gun. These effects are particularly severe when the sample is much larger than the analysis region.

EP-A-0,537,961 discloses a charged particle energy analyser, which uses a magnetic lens to collect the secondary electrons produced from the sample surface. The magnetic lens is also used to bring unfocused or purposely produced electrons to the sample for charge neutralisation by using the magnetic field to confine the flood electrons close to the axis of the system. However, such an analyser requires a magnetic lens and therefore has limited application.

U.S. Pat. No. 4,680,467 discloses a spectroscopic system, in which an electrically conductive grid or mesh is positioned in closely spaced relationship to the surface of the sample, in order to smooth the gradients in the electrical potential in the region of the analysis beam. However, the use of a grid introduces an interfering element and has limited applicability.

A further technique for addressing the negative charge build-up involves admitting inert gas into the analysis chamber, in order to produce a flux of low-energy, positive ions, for neutralising the negative charge. U.S. Pat. Nos. 5,432, 345 and 5,990,476 make use of this technique by providing an ion gun in addition to an electron gun.

Thermo Electron Corporation has disclosed a flood gun, which is described in technical note VG022T, entitled "Method for Charge Compensation on Sigma Probe, Theta Probe and Theta 300" and which is illustrated in FIG. 1. The flood gun 1 comprises a cathode arrangement 2, which comprises an electron source 3 for generating electrons via thermionic emission. An anode arrangement 4, downstream of the cathode arrangement 2, acts to extract the electrons into a plenum chamber 5. A focusing and control assembly 6 then focuses the electrons into an electron flood beam. A gas inlet 7 is provided in the plenum chamber 5, for connection to a gas supply (not shown), preferably of a noble gas such as argon. A relatively small proportion of the argon gas admitted into the plenum chamber 5 is ionized by the electrons passing through the gas. The ions generated travel in all directions, since there is no capability of focusing them, and only a small fraction pass out of the gun 1. These ions arrive at a sample as a broad, diffuse flood of ions, typically at a current of less than 1 nA and at an area of at least several mm across. There is no means of focusing the positive ions in the flood gun 1 and the relatively low gas pressure which may be admitted to the plenum chamber 5 restricts the ion current which can be produced.

There is a need, therefore, for an improved flood gun. It would be desirable for such a flood gun to provide an improved charge neutralisation performance so that the measurement resolution of the analysis technique may, in turn, be improved. In addition, it would be desirable for such a flood gun to be capable of accommodating a primary beam of higher flux density. Non-uniform samples, having rough surfaces, are known to be particularly difficult to analyse using existing techniques, so it would also be desirable for such a flood gun to address this problem.

The present invention aims to address the above and other objectives by providing an improved flood gun.

SUMMARY OF THE INVENTION

According to a first aspect of the present invention, there is provided a flood gun for charge neutralization of an analysis region of a sample downstream of the flood gun, comprising a first source of electrons; a second source of positively charged particles; and an extraction and focusing assembly, arranged to (i) extract a first, electron beam from the first source and focus the first beam to a first flood area at the analysis region; and (ii) extract a second, positive particle beam from the second source and focus the second beam to a second flood area at the analysis region.

The provision of a single flood gun has clear cost benefits over the use of two separate guns. In addition, the negative and positive beams may readily be ejected coaxially, being focused to respective first and second flood areas of different sizes. This is particularly advantageous when the surface of a sample is non-uniform or rough, since the beams may be directed to the same region of the sample, at the same angle of incidence. In prior art separate flood gun arrangements, by contrast, some parts of the sample may be shadowed from one or other of the beams, leading to non-uniform charge neutralization of the analysis region. For this reason, it is preferable to mount the flood gun with its axis as closely as possible to that of the irradiating primary beam source. The flood gun of the present invention provides a clear advantage over separate flood gun arrangements in this respect.

The flood gun of the present invention is capable of producing beams of low-energy electrons and low-energy positively charged particles, both of which may be focused to respective small spots on a sample, which is not possible with the prior art flood gun 1. In addition, the beam current obtainable with the flood gun for either beam is significantly higher than that available with the flood gun 1. Indeed, by adjusting control signals applied to the extraction and focusing assembly, it is possible to control the energy and current of the negative beam and positive beam, so that the flood gun may be optimised for any particular application. The flood gun of the present invention is therefore able to provide more effective charge neutralization in comparison with the flood gun 1.

Preferably, the source of positively charged particles comprises a gas ionization zone and a gas supply port, for receiving a supply of an inert gas within the gas ionization zone, the gas ionization zone being arranged to receive therein a supply of ionizing particles capable of ionizing atoms or molecules of the inert gas. This offers the ability to provide a higher pressure of gas to be ionized, which in turn results in a greater ion beam current being obtainable, improving charge neutralizing performance still further. In addition, the overall size of the flood gun may be reduced by the provision of such a dedicated gas ionization zone.

Preferably, the extraction and focusing assembly is arranged to extract and focus both the electron beam and the positive particle beam simultaneously. The flood gun may be readily arranged to produce a focused beam of electrons and a focused beam of positive particles concurrently, in a single mode of operation. That is, once selected, the various components of the flood gun and potentials applied to them may remain unchanged during operation, while providing focused beams of relatively high current at the same time. This provides a comparatively simple flood gun.

Alternatively, the extraction and focusing assembly is arranged to extract and focus the electron beam and the positive particle beam alternately, in an electron beam mode and an ion beam mode respectively. In this arrangement, the advantage of greater flexibility is provided, since it is possible to switch or adjust the potentials applied to the various components between modes. For example, the extraction and focusing assembly may be switched in either mode to accelerate the respective beam. Focusing of a beam under acceleration is preferable under conditions where space charge effects become limiting, such as with high beam currents. Since it is possible to have complete control over the flood gun parameters in each mode, the benefit of a highly efficient flood gun is offered. The flood gun may be readily optimised to provide a focused negative particle beam and a focused positive particle beam, by switching the parameters between modes. In particular, significantly larger extraction potentials may be used in the pulsed capacity of the flood gun, one benefit of which is that both ion and electron beam currents may be increased.

Preferably, the gas ionization zone is a confinement zone, arranged substantially to confine the gas therein. Preferably still, the flood gun further comprises a differential pumping port adapted to be connected to a differential pump for evacuating the flood gun to the second pressure based on a difference between the first gas pressure generated within the gas ionization zone and a relatively lower, third pressure of an analysis chamber in which the flood gun is employed. In this way, significantly higher gas pressures may be achieved within the gas ionization zone—improving the yield of positive ions generated therein—while limiting the effect of such pressure on other parts of the flood gun and, in turn, on the analysis chamber in which the flood gun is used.

Other preferred features are set out in the description, and in the dependent claims which are appended hereto.

BRIEF DESCRIPTION OF THE DRAWINGS

The present invention may be put into practice in a number of ways and some embodiments will now be described, by way of example only, with reference to the following figures, in which:

FIGS. 8a and 8b show, schematically, an electron beam trajectory and an ion beam trajectory respectively, obtainable with the flood gun of either FIGS. 6a and 6b or FIG. 7.

DETAILED DESCRIPTION OF THE PREFERRED EMBODIMENTS

Figure 2:
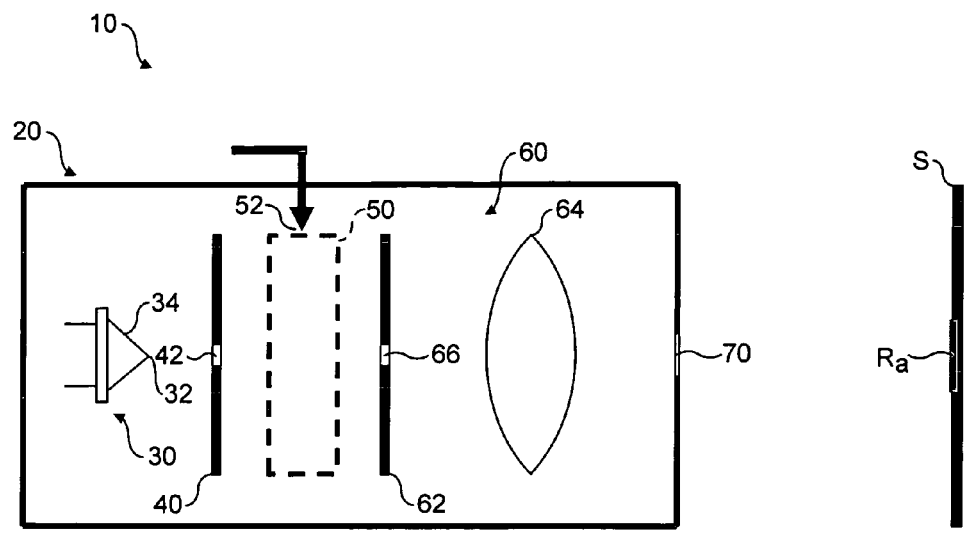
FIG. 2 shows, highly schematically, a combined electron and ion flood gun according to a first embodiment of the present invention.

Referring to FIG. 2, there is shown a combined electron and ion flood gun 10, according to a first embodiment of the present invention. As will be understood, the combined flood gun 10 comprises a generally elongate body (not shown) which has at one end a gun assembly 20 and is attached at the other end to a mounting flange assembly (not shown). The gun assembly 20 is adapted to generate and focus both an electron flood beam and an ion flood beam, as will be described in further detail below. The mounting flange assembly is used to attach the combined flood gun 10 to, for example, a wall of a chamber (not shown), in which surface analysis of a sample S is to take place. The chamber may therefore also contain a primary beam irradiation source and a secondary particle analyser, forming a spectroscopic system arranged to perform XPS, AES, SIMS, UPS, SEM, EDX, or the like. Connected to the mounting flange assembly is an electrical feedthrough (not shown) which allows connection of one or more power supplies (not shown) to electrical components within the combined flood gun 10. Other gun assembly components may also be connected to respective components external of the gun assembly 20 via the generally elongate body and mounting flange assembly; for example, a gas inlet port 52 to be described below may be so connected to a gas inlet assembly (not shown).

Referring in detail to the gun assembly 20 schematically shown in FIG. 2, the gun assembly comprises a source of electrons 30, which includes a cathode 32 and a filament 34. The cathode 32 generates electrons via thermionic emission. The cathode 32 is preferably formed of a material having a low work function in order to provide electrons with a low energy spread. Lanthanum hexaboride ($LaB_6$) is most preferred, since this material has a particularly low work function, is durable and provides satisfactorily reproducible results. Other low-work-function materials, such as oxide cathodes, thoriated cathodes, or dispenser cathodes, may alternatively be used. Simple metal cathodes, such as tungsten or tantalum cathodes, may also be used, but with some degradation in energy resolution. The filament 34 is preferably formed of tungsten wire or tape and is arranged to heat the cathode 32 by means of resistive heating. In a relatively simple arrangement, it may be the surface of the filament 34 itself which emits electrons, in which case the filament and the cathode 32 are the same item. In an alternative emitter, the cathode 32 may be provided by a thin coating of low-work-function material, such as thorium oxide, on the surface of the filament 34. Alternatively still, the cathode 32 may be a separate item, such as a single crystal of $LaB_6$, adjacent or attached to the filament heater. Heating of the cathode 32 may be achieved either directly or indirectly.

Downstream of the electron source 30 is an electron extraction electrode 40. The electron extraction electrode 40 is operated at a potential $V_2$ which is more positive than a potential $V_1$ applied to the cathode 32, thereby generating in use an electric field between the cathode and extractor which extracts and accelerates the thermionically produced electrons in a downstream direction. An aperture 42 is formed through the electron extraction electrode 40 and arranged coaxially with the cathode 32 of the electron source 30. The aperture 42 is arranged such that electrons are accelerated by the electron extraction electrode 40 and pass through the aperture, thereby forming an electron beam. The magnitude of the potential $V_2$ applied to the electron extraction electrode 40 (or the difference in potentials between the cathode 32 and the electron extraction electrode 40) may be set to any value suitable for generating a desired electron beam current, preferably of between 1 µA and 20 µA, at the sample S.

Downstream of the electron extraction electrode 40 is a gas ionization zone 50. The gas ionization zone 50 comprises a gas inlet port 52, by which the gas ionization zone is connected to a supply (not shown) of an inert gas, such as argon. Of course, a variety of gaseous atoms or molecules can be employed depending on the particular application, but a noble gas is preferred. One advantage of the provision of the gas ionization zone 50 in the combined flood gun 10 is that pressures in the region of $10^{-1}$ Pa may be maintained while evacuating the remainder of the gun assembly 20 to a conventional, relatively lower operating pressure of around $10^{-4}$–$10^{-5}$ Pa. This lower pressure is typically required to minimise the effect of the introduction of a flood gun into an analysis chamber, in which such pressures are needed to maintain a "clean" environment for the irradiation beam, the sample and the secondary particle analyser.

The gas ionization zone 50 occupies a well-defined or distinct region within the combined flood gun 10 and it is this feature which permits the relatively higher gas pressure within the gas ionization zone. The structure of the gas ionization zone 50, which is schematically illustrated by dashed lines in FIG. 2, may be provided in a number of ways. For example the gas ionization zone 50 may be bounded on one or both sides by other "active" components of the combined flood gun 10, such as the electron extraction electrode 40 and/or a further downstream electrode (e.g. 62), or by a ceramic front plate and/or a ceramic back plate (both not shown). In any case, the relatively high gas pressure within the gas ionization zone 50 facilitates efficient ionization of the inert gas atoms/molecules supplied to the gas ionization zone via the gas inlet port 52. Whether as a result of a positive potential applied to one or more gas cell walls defining the gas ionization zone 50, or the electric field generated by at least the cathode 32 and the electron extraction electrode 40, the electron beam is accelerated through the electron extraction electrode aperture 42 and into the gas ionization zone. It is preferable for the acceleration of the electron beam to be such that the electrons enter the gas ionization zone 50 with an energy at least corresponding to an electron-induced ionization energy for the inert gas. For argon, this energy is preferably at least 18 eV.

Energetic electrons accelerated into the gas ionization zone 50 and which collide with atoms of gas in the gas ionization zone cause ionization of those atoms. The gas ionization zone 50 thereby acts as a source of positive ions, which may then be extracted from the gas ionization zone and formed into an ion beam.

To this end, an extracting lens sub-assembly 60 is disposed downstream of the gas ionization zone 50. The extracting lens sub-assembly 60 is arranged to perform both an extracting function and a focusing function. FIG. 2 illustrates the extracting lens sub-assembly 60 comprising a second extraction electrode 62 and a downstream focusing lens 64; however, the extracting lens sub-assembly 60 may alternatively be provided by a single element arranged to perform the functions of both the second extraction electrode 62 and the focusing lens 64, or the extracting lens sub-assembly may comprise two or more elements each of which is so arranged. Furthermore, the focusing lens 64 may comprise one or more beam-focusing elements, depending on the requirements of any particular application.

In the embodiment shown in FIG. 2, the second extraction electrode 62 comprises an aperture therethrough and arranged coaxially with the aperture 42 of the electron extraction electrode 40 and the filament 34 of the electron source 30. In this way, an electron beam and an ion beam are either maintained or generated from the electrons and ions respectively exiting the gas ionization zone 50. The focusing lens 64 is arranged to focus the electron beam to an electron flood area $A_e$ at an analysis region $R_a$ of the sample S downstream of the combined flood gun 10, and is also arranged to focus the ion beam to an ion flood area $A_i$ at the analysis region $R_a$. The focused beam(s) exits the combined flood gun 10 via a gun aperture 70 formed at an end of the gun assembly 20 distal the electron source 30.

One advantage of the embodiment shown in FIG. 2 is that a potential $V_{3,4}$ applied to the extracting lens sub-assembly 60 (whether applied to one or both of the second extraction electrode 62 [$V_3$] and the focusing lens 64 [$V_4$] and whether or not these are provided by a single element) may be selected such that (i) both the electron beam and the ion beam exit, or are extracted from, the gas ionization zone 50 and are focused to their respective flood areas $A_e$, $A_i$ concurrently; (ii) only the electron beam exits, or is extracted from, the gas ionization zone and is focused to the electron flood area $A_e$; or (iii) only the ion beam exits, or is extracted from, the gas ionization zone and is focused to the ion flood area $A_i$. In this way, the charge-neutralising performance of the combined flood gun 10 may be optimised according to any particular application of it. For example, in case (i), the potential $V_{3,4}$ applied to the extracting lens sub-assembly 60 may be a constant value, selected such that both the electron beam and the ion beam are able to be drawn out of the gas ionization zone 50 and focused to respective flood areas $A_e$, $A_i$ at the sample S simultaneously (e.g. $|V^{3,4}|\sim10^1$ V). This may be achieved either by accelerating the electrons and decelerating the ions (i.e. by generating a positive field gradient between the gas ionization zone and the extracting lens sub-assembly 60) or by a accelerating the ions and decelerating the electrons (i.e. by generating a negative field gradient between the gas ionization zone and the extracting lens sub-assembly 60). In order to provide effective charge neutralisation in cases (ii) and (iii), the potential $V_{3,4}$ applied to the extracting lens sub-assembly 60 may be switched between two (or more) alternate values, such that pulses of electrons and pulses of ions are alternatively focused to their respective flood areas $A_e$, $A_i$ at sample S. In electron beam mode, the potential $V_{3,4}$ is preferably positive and most preferably relatively highly positive ($\sim10^2$ V). In the ion beam mode, the potential $V_{3,4}$ is negative and preferably highly negative ($\sim10^2$ V). In this way, ions may be substantially constrained within the gas ionization zone 50 by the highly positive gradient of the electric field in the electron beam mode; and the electrons may be retarded, or even constrained within the gas ionization zone, by the highly negative gradient of the electric field in the ion beam mode.

The combined flood gun 10 of the present embodiment, whether arranged for simultaneous or pulsed operation, is capable of generating both a focused beam of low-energy electrons and a focused beam of low-energy ions. For the electron beam, it is preferable for the electrons to arrive at the sample S with an energy in the range of 1 eV to 10 eV, but preferably less than approximately 6 eV. It is also preferable for the electron beam current to be between 1 μA and 20 μA at the sample S. The electron flood area $A_e$ will depend on the particular application of the combined flood gun 10, but is typically of a radius in the range 10 μm to 1 mm for XPS and may be as small as a few nanometres for electron beam analysis techniques. For the ion beam, it is preferable for the ions to arrive at the sample S with an energy in the range of 1 eV to 30 eV, but preferably less than approximately 20 eV. It is also preferable for the ion beam current to be between 10 nA and 100 nA at the sample S. When measured on a conductive surface, the ion flood area $A_i$ is typically larger than the electron flood area $A_e$, preferably at least twice the area $A_e$, in the range 1 mm to a few mm.

The method of operation of the embodiment of the combined flood gun 10 in FIG. 2 will now be described. The combined flood gun 10 is for use in providing charge neutralisation to the analysis region $R_a$ of a sample S undergoing secondary particle emission analysis. The electron source 30 produces electrons from the cathode 32, typically via thermionic emission resulting from heating the cathode. The electrons are accelerated downstream of the electron source 30 by the electron extraction electrode 40 and pass through the aperture 42 therein, forming an electron beam. The electron beam passes into the gas ionization zone 50 and, in the simultaneous combined flood gun mode and the electron beam mode of the pulsed combined flood gun mode, the beam exits the gas ionization zone and continues downstream towards the gun aperture 70. The electron beam may exit the gas ionization zone 50 in this way as a result of momentum gained under the accelerating action of the electron extraction electrode 40 only. Alternatively, the extracting lens sub-assembly may have a potential $V_{3,4}$ applied to it which generates a positive electric field gradient between the gas ionization zone 50 and the extracting lens sub-assembly and so accelerates the electron beam leaving the gas ionization zone. In the electron beam mode in the pulsed combined flood gun operation, $V_{3,4}$ may be much larger than in the simultaneous operation, since the ions are not also being extracted. This offers the possibility of focusing the electron beam to a relatively higher degree, which may be particularly desirable in certain applications. Alternatively still, the electron momentum may be sufficiently high that the electrons are able to exit the gas ionization zone 50 when a (relatively small) negative electric field gradient exists between the gas ionization zone 50 and the extracting lens sub-assembly 60. In any case, the extracting lens sub-assembly 60 focuses the electron beam so that it passes out of the combined flood gun assembly 10, through the gun aperture 70, and to the electron flood area $A_e$ at the analysis region $R_a$ of the sample S.

The electrons extracted from the cathode 32 and accelerated into the gas ionization zone 50 by the electron extraction electrode 40 have a sufficient energy to cause ionization of the atoms/molecules of gas supplied within the gas ionization zone. Therefore, a first proportion of the electrons collide with and ionize the gaseous atoms/molecules, while a second proportion are able to pass through and out of the gas ionization zone 50, according to the manner described above. In the simultaneous combined flood gun operation and in the ion beam mode of the pulsed combined flood gun operation, the positive ions formed within the gas ionization zone 50 are extracted from the gas ionization zone and formed into an ion beam which continues downstream towards the gun aperture 70. The ions are forced out of the gas ionization zone 50 as a result of the electric field gradients set up in the vicinity of the gas ionization zone. For example, in the simultaneous combined flood gun operation, there may be a negative electric field gradient between the electron extraction electrode 40 and the downstream side of the gas ionization zone 50, so that the ions are accelerated in the downstream direction, out of the gas ionization zone. The electric field gradient may then continue to be negative between the gas ionization zone 50 and the extracting lens sub-assembly 60, or it may be positive, but of a lower magnitude than the immediately upstream negative gradient so that the ions—although being decelerated—have sufficient energy to pass out of the combined flood gun 10 and reach the sample S. In the ion beam mode in the pulsed combined flood gun operation, $V_{3,4}$ may be relatively highly negative, since the combined flood gun 10 is not focusing the electron beam in this mode. The same benefit of increased focusing capability of the ion beam may be provided in this way. In any case, the extracting lens sub-assembly 60 focuses the ion beam so that it passes out of the combined flood 10, through the gun aperture 70, and to the ion flood area $A_i$ at the analysis region $R_a$ of the sample S.

In the pulsed combined flood gun operation, the gun may be switched rapidly between the electron beam and ion beam modes. In this way, any or all of the parameters for the respective beam modes may be optimised as required or desired. If the pulsed mode of the combined flood gun 10 is switched with a switching period which is faster—preferably significantly faster—than the time constant of the sample S and its surroundings, then the potential $V_s$ of the sample surface may be maintained at a substantially constant value. Preferably, the pulsed combined flood gun 10 is switched at a frequency of between 10 kHz and 1 MHz. As will be understood, the ratio of the electron beam current to ion beam current reaching the sample S may be adjusted by varying the duty cycle of the switching waveform generated and applied by suitable switching electronics (not shown).

The switching electronics may be arranged to adjust or switch the potentials applied to all or some of the various electrodes in the combined flood gun 10, when switching between electron beam and ion beam modes. In this way, the optimum values of the potentials for each mode may be employed and the optimum functioning capabilities for each mode may be achieved. However, in a preferred embodiment, only the potential $V_{3,4}$ applied to the extracting lens sub-assembly 60 is switched, thereby simplifying the switching electronics. In this case, it is preferable for the cathode potential $V_1$ to be set to provide an electron beam at the sample S of a suitably low energy, preferably between 1 eV and 10 eV, most preferably below about 6 eV (i.e., $V_s-V_1 \sim 1$ to 10 eV). It is also preferable for the potential(s) in the vicinity of the gas ionization zone 50 (e.g., the electron extraction electrode 40 and any potential applied to the gas ionization zone itself) to be such that ionization occurs readily within the gas ionization zone, but the ions extracted from the gas ionization zone are not so energetic as to cause damage to sample S. Various other combinations of switched and unswitched potentials may be readily employed and these are envisaged as part of the present invention.

Figure 3:
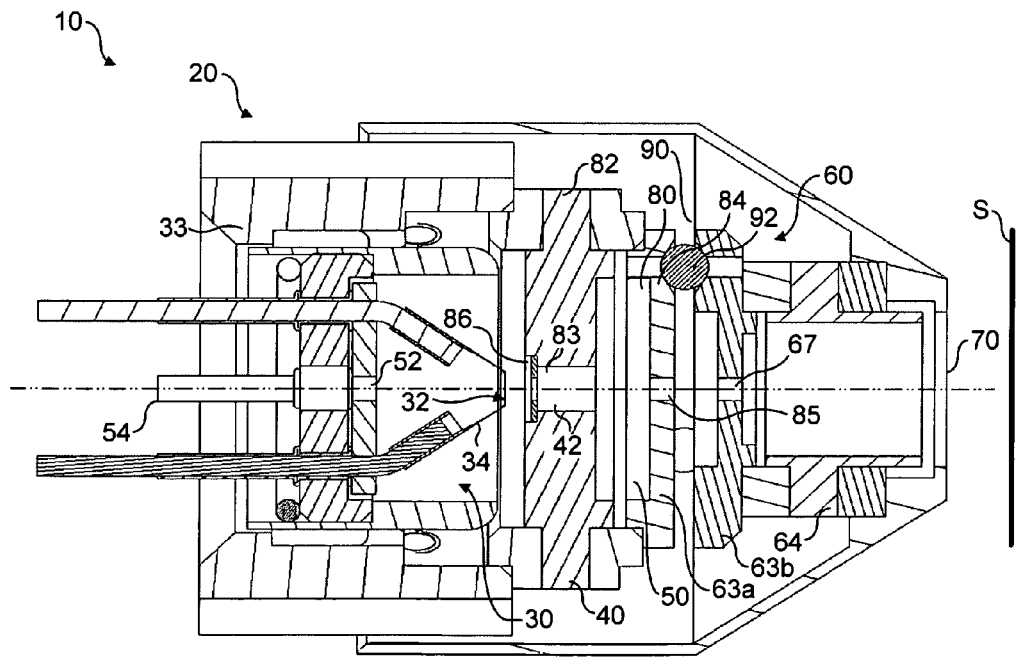
FIG. 3 shows a cross-sectional view of a flood gun according to a second embodiment of the present invention.

As described above, the combined flood gun 10 of the present invention may be operated in either a simultaneous mode or a pulsed mode. FIG. 3 shows an embodiment of the present invention which is particularly suitable for use in the simultaneous combined flood gun mode. Like items of the figures will be referred to using the same reference numerals throughout this specification.

The cathode 32 is provided by a cathode assembly 33, which, in particular, holds the filament 34 in position. Electrons are thermionically produced from the cathode 32 as described above.

The gas ionization zone 50 is provided by a gas ionization cell 80. The gas ionization cell 80 has an upstream first cell wall 82 and an downstream, second cell wall 84. The first and second cell walls 82, 84 have an inlet aperture 83 and an outlet aperture 85 respectively therethrough, to allow passage of the electron beam into, and both the electron beam and the ion beam out of, the gas ionization cell 80. As explained above, the provision of such a defined gas ionization zone 50, especially having apertures 83,85 which act to restrict gas flow out of the zone, allows the gas pressure in the gas ionization zone to be several orders of magnitude higher than with the prior art arrangements. For example, in the prior art flood gun shown in FIG. 1, the volume of the plenum chamber 5 in which ions are produced is large and the gas inlet 7 has a large opening into the chamber, which allows the chamber pressure to rise to nearly that of the ionisation region. In surface analysis, it is generally considered unacceptable for the pressure of the chamber (the chamber in which the sample S is analysed, not a part of the gun itself) to rise above about $10^{-5}$ Pa, so the gun pressure in the ionization region of the flood gun 1 must remain at around this value. Because in the combined flood gun 10 of the present embodiment, the ionization zone has a relatively smaller volume and is bounded with inlet and outlet apertures, the pressure in the gas ionization 50 may be several orders of magnitude larger than an external chamber pressure, resulting in a more efficient ionization process and a higher ion beam current. Preferably, the inlet and outlet apertures 83,85 are less than 2 mm in diameter. The diameter of the apertures 83,85 may be further narrowed by introducing one or more restricting apertures 86 within the inlet or outlet apertures.

In FIG. 3, the first cell wall 82 not only defines a boundary of the gas ionization zone 50, but also acts as the electron extraction electrode 40. This has the benefit of reducing the number of components in the gun assembly 20 and also provides an extraction field right into the gas ionization zone 50. The extracting lens sub-assembly 60 is provided in this embodiment by a cell electrode 63a and an intermediate electrode 63b, which together form the second extraction electrode 62, and the focusing lens 64. The cell electrode 63a also acts as the second cell wall 84 of the gas ionization cell 80.

The gas inlet port 52 in this embodiment is coaxial with the inlet and outlet apertures 83,85 and passes into the cathode assembly 33. The gas inlet port 52 is connected to a supply line 54 which runs in an upstream direction away from the gun assembly 20, for connection to a supply of the inert gas. Gas is drawn into the gas ionization cell 80 from the gas inlet port 52, under the action of a differential pump (not shown) connected to a differential pumping port 90, located downstream of the outlet aperture 85 of the gas ionization cell.

The cell electrode 63a, provided by the second cell wall 84, may be maintained at a potential which is slightly more negative than the potential applied to the electron extraction electrode 40, so that a small field gradient exists across the gas ionization cell 80 and ions are efficiently extracted through the outlet aperture 85 in the second cell wall.

Between the second cell wall 84 and the intermediate electrode 63b, there is a differential pumping port 90, by means of which the combined flood gun 10 may be pumped, based on the difference between the gas pressure in the gas ionization cell 80 and an operating pressure of a chamber (not shown) in which the combined flood gun 10 is used. Thus any gas leaving the gas ionization cell 80 through outlet aperture 85 may be differentially pumped away before reaching the analysis chamber.

After passing through an aperture 67 in intermediate electrode 63b, the electron and ion beams are both focused to their respective flood areas $A_e$, $A_i$ at the sample S. Because the desired energies of the electrons (~1–10 eV, preferably ~4–6 eV) and of the ions (~20–30 eV) are known, the focusing lens 64 is arranged to focus both beams simultaneously using a single applied potential, despite the opposite polarity of the electrons and ions. With the embodiment of FIG. 3, a positive potential applied to the focusing lens 64 is able to focus the electrons in an accelerating capacity and to focus the ions in a decelerating capacity. The use of an electrostatic lens arranged to be operated simultaneously in an accelerating capacity (for the electrons, in this embodiment) and a decelerating capacity (for the ions) is particularly advantageous. Due attention should preferably be paid to space charge effects in both the electron beams and the ion beams to ensure that relatively small flood areas $A_e$, $A_i$ are achieved at the sample S. As is known, the smallest spots in low-energy electron beams are obtained by using an objective lens placed as close as possible and practicable to a sample, and by arranging for the electrostatic field from the gun to penetrate into the region between the gun and the sample (see, for example, Harting and Burrows: "A low convergence electron gun for energies above 2 eV", Review of Scientific Instruments, Vol. 41, No. 1, January 1970, pp 97–101).

Figure 1:
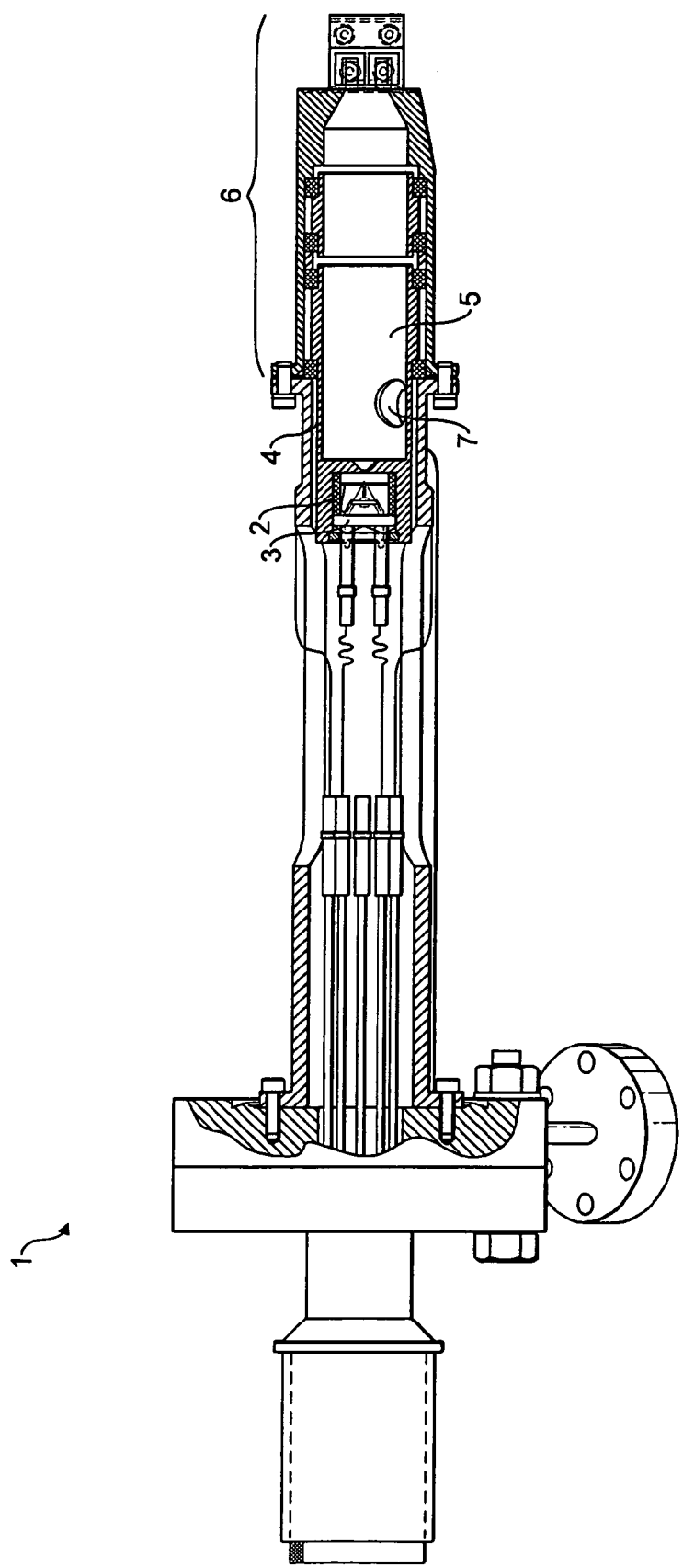
FIG. 1 shows a prior art flood gun.

The combined flood gun 10 of the present embodiment is significantly smaller than that shown in FIG. 1, as a result of the well-defined gas ionization zone 50 provided by the gas ionization cell 80, instead of a general ionization region within the relatively large plenum chamber 5. This allows the combined flood gun 10 to be fitted in an analysis chamber closer to the sample S, so that, in addition to the focusing capability of the combined flood gun, smaller spot sizes (flood areas $A_e$, $A_i$) may be achieved, even with the effect of space charge.

In one embodiment, the focusing lens 64 may be a quadrupole lens, arranged to provide steering of the electron beam without significantly affecting the higher energy ion beam. In fact, if desired, any number of steering plates or coils (not shown) may be incorporated into the extracting lens sub-assembly 60. Alternatively, these may be fitted to the end of the combined flood gun 10, and in either case are used to direct the electron and ion flood beams more precisely to their respective flood areas $A_e$, $A_i$.

One advantage of the simultaneous mode of the combined flood gun 10 is that potentials applied to the various electrodes may be constant. The actual set of potentials selected will of course influence the performance of the combined flood gun 10, which may be readily set up to optimise the focusing of the electron beam or to optimise the focusing of the ion beam by suitably adjusting the potentials.

By way of example only, the preferred electrode potentials and other parameters for the embodiments of FIG. 2 and FIG. 3 (using argon gas) are as follows:

FIG. 2:
    Cathode 32, $V_1$ ~−4 V
    Electron extraction electrode 40, $V_2$ ~+40 V
    Second extraction electrode 62, $V_3$ ~+20 V
    Focusing lens 64, $V_4$ ~+25 V FIG. 3:
    Cathode 32, $V_1$ ~−4 V
    Electron extraction electrode 40, $V_2$ ~+30 V
    Cell electrode 63a, $V_{3a}$ ~+10 V
    Intermediate electrode 63b, $V_{3b}$ ~+20 V
    Focusing lens 64, $V_4$ ~+25 V
    Analysis chamber pressure ~$10^{-5}$ Pa
    Gas ionization zone pressure ~$10^{-3}$ Pa
    Electron beam current at sample ~2–20 μA
    (depending flood area $A_e$)
    Ion beam current at sample ~2–20 nA
    (depending on flood area $A_i$)

Figure 4:
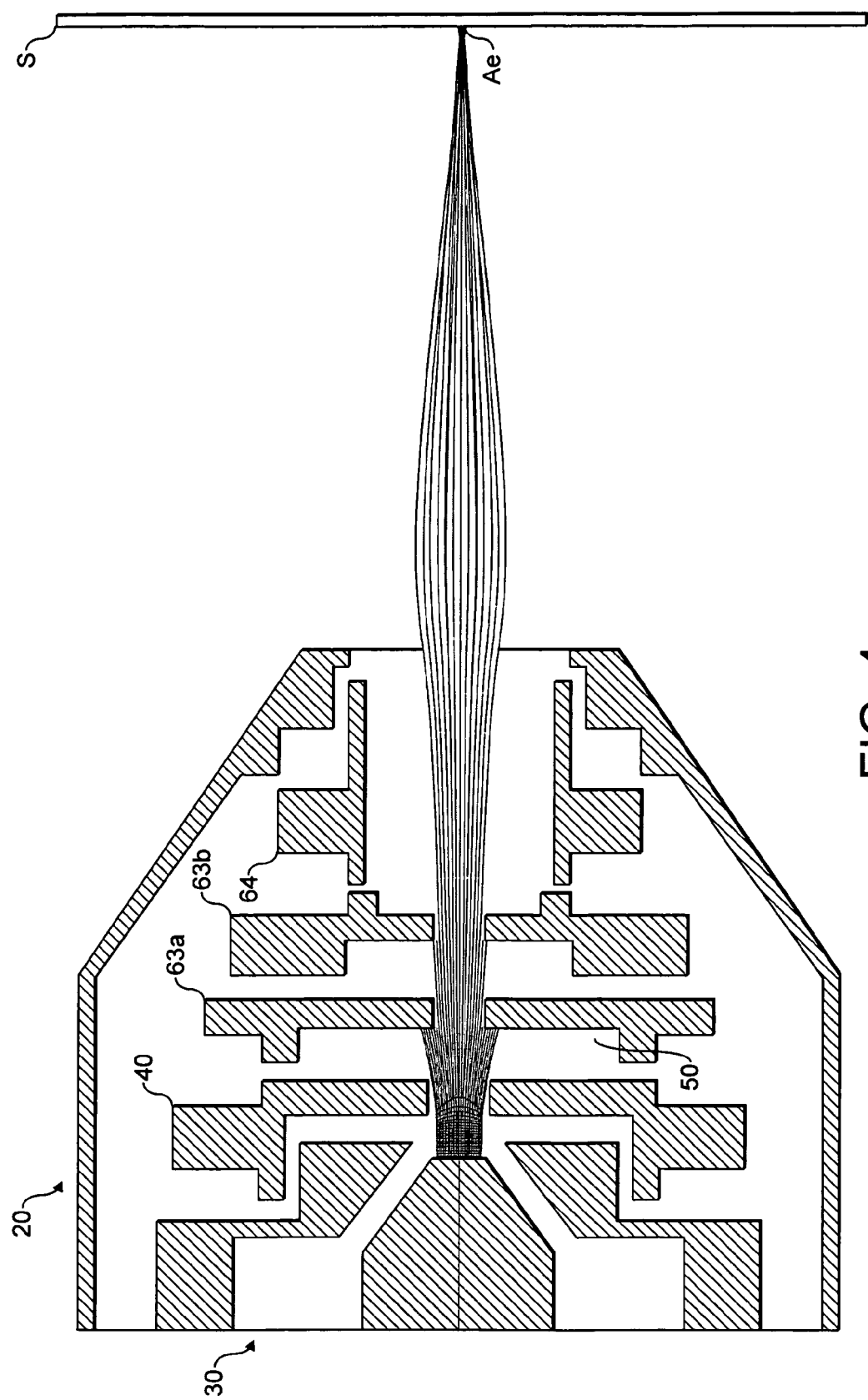
FIG. 4 shows a schematic electron beam trajectory obtainable with the flood gun of FIG. 3.
Figure 5:
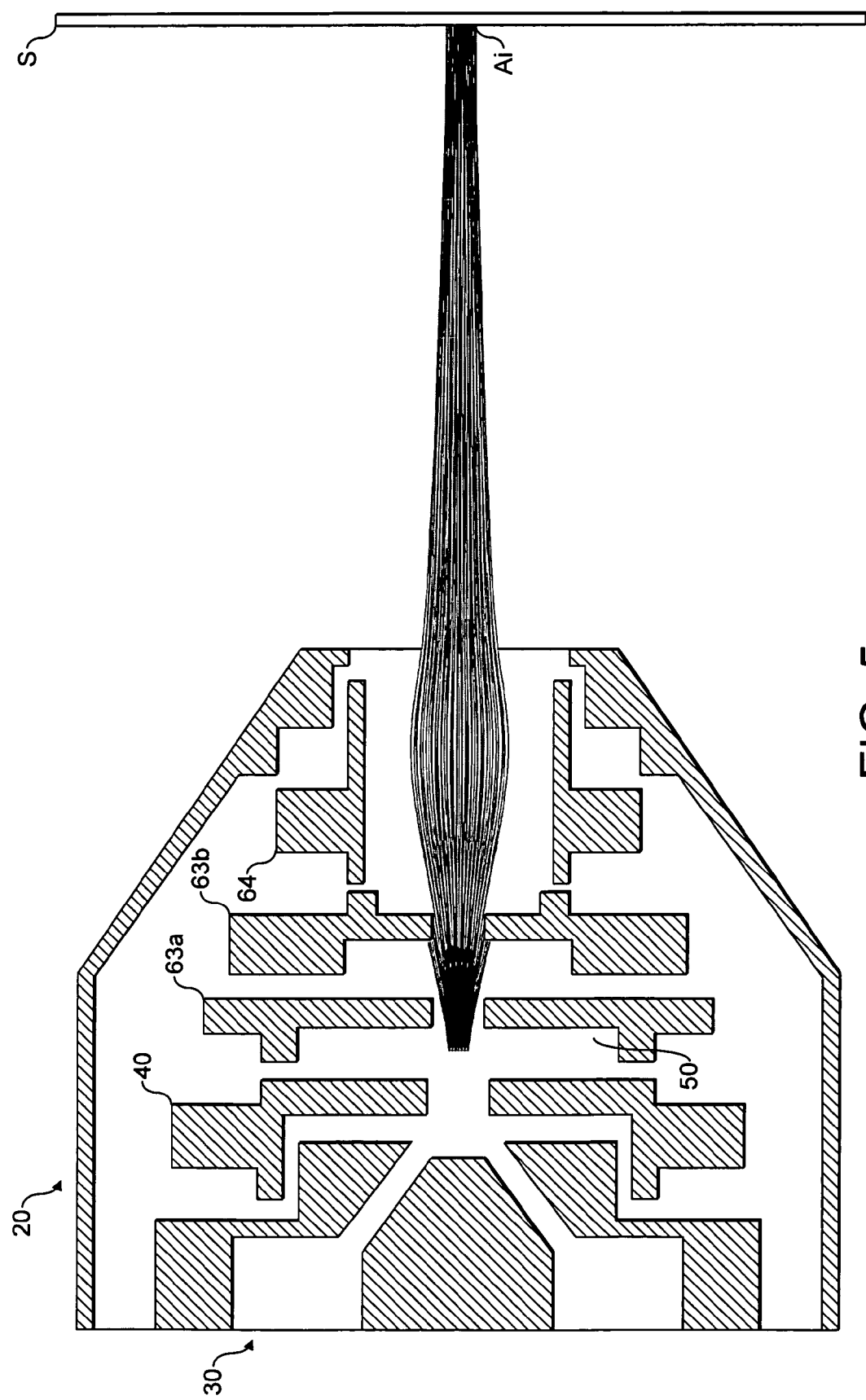
FIG. 5 shows a schematic ion beam trajectory obtainable with the flood gun of FIG. 3.

FIGS. 4 and 5 show a schematic electron beam trajectory and a schematic ion beam trajectory respectively, obtainable with the combined flood gun 10 of FIG. 3. The two beams have been illustrated in separate figures for clarity, although in the simultaneous mode of the combined flood gun 10 both beams are in fact focused together.

Figure 6A:
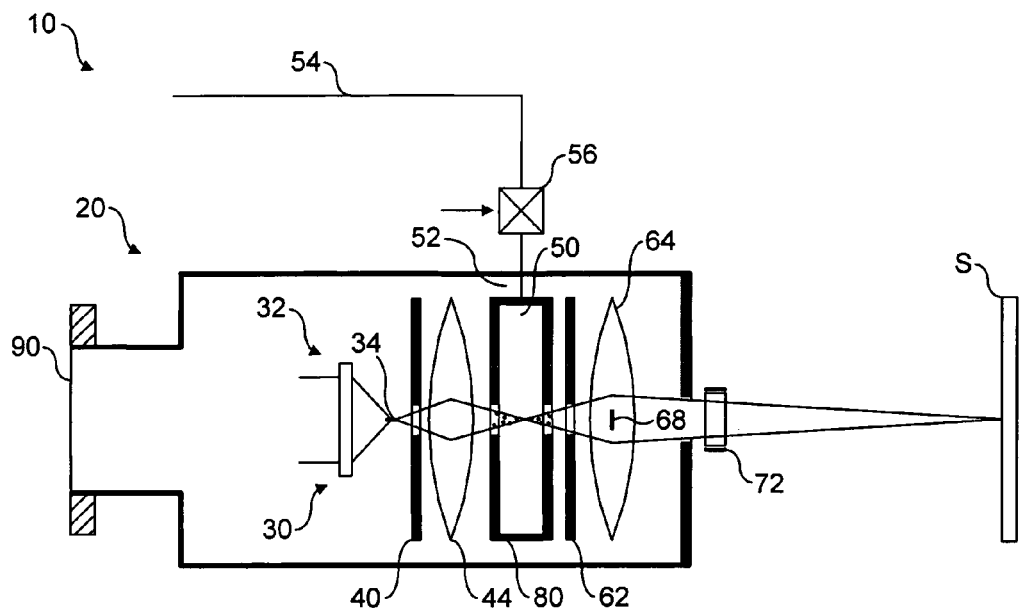
FIGS. 6a and 6b show, schematically, a flood gun according to a third embodiment of the present invention, in an electron beam mode and in an ion beam mode respectively.
Figure 6B:
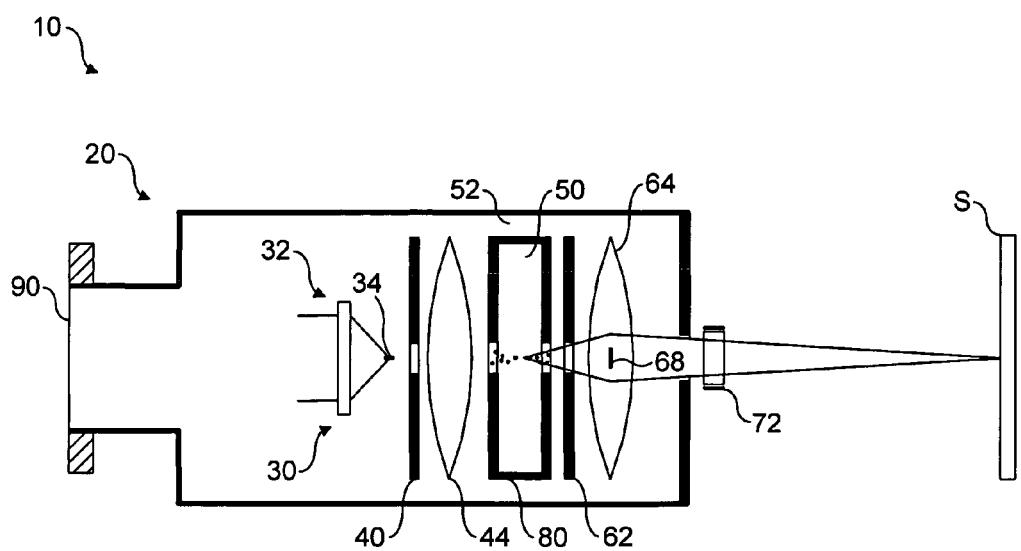

FIGS. 6a and 6b show, schematically, an embodiment of the present invention which is particularly suitable for use in the pulsed combined flood gun mode, with FIG. 6a representing the electron beam mode and FIG. 6b representing the ion beam mode.

Located between the electron extraction electrode 40 and the gas ionization zone 50 is an electron focusing lens 44. As discussed above, it is possible in the pulsed combined flood gun mode to apply a relatively high potential $V_2$ to the electron extraction electrode 40, since the downstream electrode potentials are switched between electron and ion beam modes and may therefore be used to control the electron energy after acceleration by the electron extraction electrode as required in each mode. The advantages of a relatively high electron energy at the electron extraction electrode 40 are that efficient ionization of the gas in the gas ionization zone 50 may be achieved (especially if the electrons have an energy of the order of 75 eV) and the electron beam may be focused into the gas ionization 50 by the electron focusing lens 44, to improve throughput.

The gas inlet port 52 in this embodiment is shown schematically as being focused through the gas ionization cell 80, with a leak valve 56 connecting the port to the supply line 54, so that gas may be supplied directly into the gas ionization cell. Of course a similar arrangement of the gas inlet port 52 to that of FIG. 3 may alternatively be used. The differential pumping port 90 is shown schematically as being located at the upstream end of the gun assembly 20—for ease of connection to a differential pump (not shown) external and upstream of the gun assembly—and it is preferable for the port to be in communication with the region between the gas ionization cell 80 and the second extraction electrode 62 by means of a connecting channel, annular conduit or the like (not shown).

Second extraction electrode 62 provides an extraction field from the gas ionization cell 80, which in this embodiment is a distinct structure, separate from the electrodes upstream and downstream of the gas ionization zone 50. When the pulsed combined flood gun 10 is operated in the electron beam mode, the second extraction electrode 62 is at a positive potential allowing the electrons which pass through the gas ionization cell 80 to be focused by the focusing lens 64 onto the sample S. When the pulsed combined flood gun 10 is operated in the ion beam mode, the second extraction electrode 62 is at a negative potential, which acts to extract the ions generated in the gas ionization cell 80 so that they may be focused by the focusing lens 64 onto the sample S.

With the high extraction voltages available in the pulsed combined flood gun mode, it is preferable to be able to prevent any high energy ions generated between the extraction electrode 40 and the gas ionization zone 50 from reaching the sample S, since these might otherwise cause surface damage to the sample (especially with delicate samples). In this embodiment, therefore, a stop 68 is provided, on axis, at the centre of the focusing lens 64.

Again, steering plates or coils may optionally be provided to improve the focusing performance of the pulsed combined flood gun 10. A set of steering plates 72 are illustrated downstream of the gun aperture 70. It will be understood that the electron and ion beam trajectories shown in FIGS. 6a and 6b respectively are schematic.

In the pulsed combined flood 10 mode, the combined flood gun may be readily optimised for alternate operation as a focused electron gun and a focused ion gun, by adjusting the voltages applied to the various electrodes. In the simplest form, only the potential $V_{3,4}$ of the extracting lens sub-assembly 60 is varied to achieve switching between electron and ion modes. Alternatively, an even more efficient operation of the pulsed combined flood gun 10 can be achieved if the potential $V_3$ applied to the second extraction electrode 62 and the potential $V_4$ applied to the focusing lens 64 are varied separately and/or if the gas ionization cell 80 is conductive and also has a switching potential applied to it.

Figure 7:
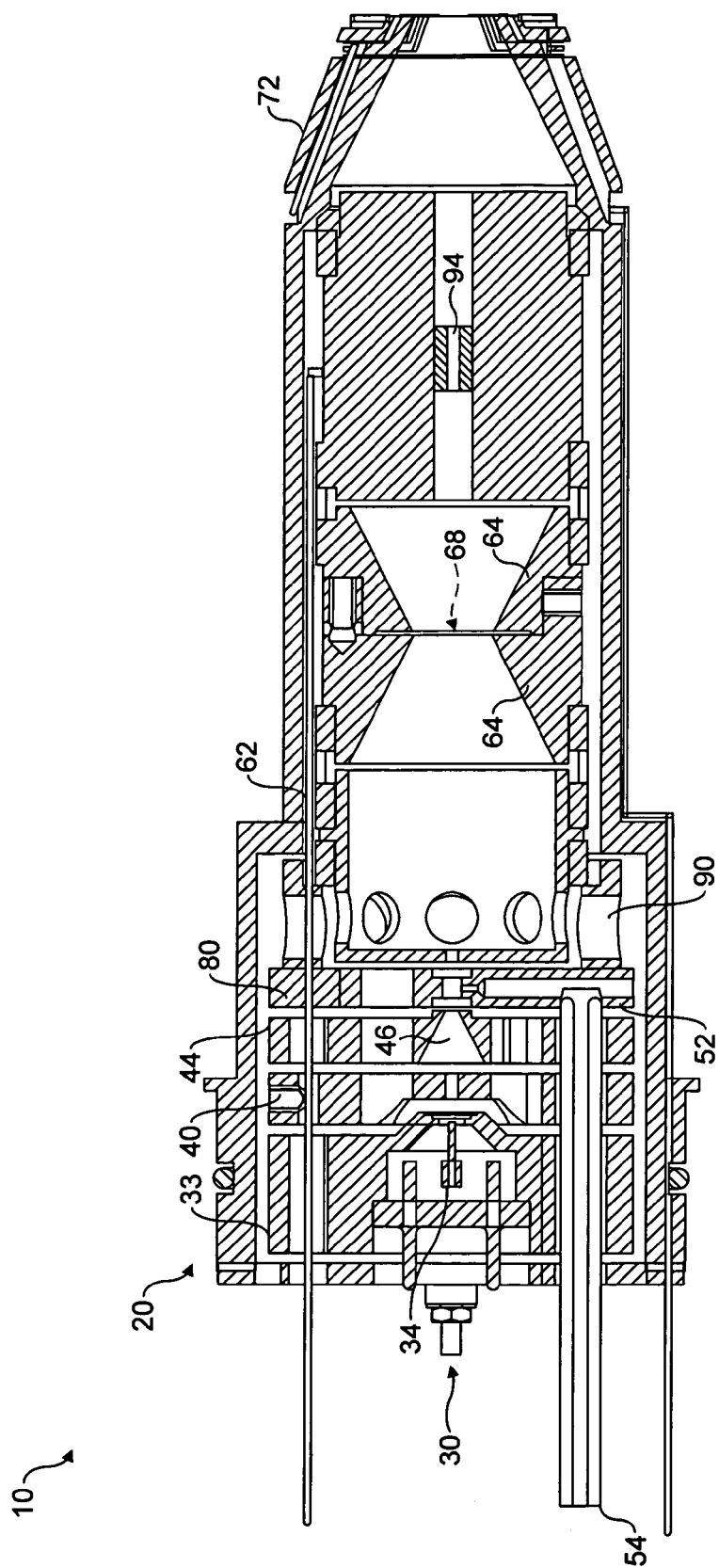
FIG. 7 shows a cross-sectional view of a flood gun according to a fourth embodiment of the present invention.

FIG. 7 shows a further embodiment of the present invention which is particularly suitable for operation in the pulsed combined flood gun mode. The electrodes in the combined flood gun 10 of the embodiment are shown with a preferred—but only illustrative and exemplary—geometry. For example, the electron focusing lens 44 has a tapered aperture 46 therethrough, narrowing in the downstream direction. This has the advantage of improving the focusing of the electron beam into the gas ionization zone 50. The focusing lens 64 is also tapered, but from both its upstream and downstream ends towards a point of narrowest cross-section, which may or may not be at the centre of the lens 64, depending on the focusing performance desired. Preferably, though, the focusing lens 64 is generally symmetrical. Preferably also, the stop 68 is provided and located centrally and coaxially within the focusing lens 64 (shown by a dashed arrow in FIG. 7). Of course, many variations in the geometry (symmetry, shape, tapering etc.) of the electrodes of any of the embodiments of the present invention will be apparent to the skilled reader and these alternatives are intended to fall within the scope of the present invention.

In the embodiment, a gas flow restrictor 94 is located between the focusing lens 64 and the downstream end of the gun assembly 20 (in FIG. 7, before the optional steering plates 72). Since the electron beam and the ion beam can be accelerated to high energies in their respective modes in pulsed combined flood gun operation, it is possible using focusing lens 64 to focus either beam through the gas flow restrictor 94, despite its relatively small diameter, of between approximately 0.5 mm and 2 mm. This provides the option of improving the differential pumping performance of the combined flood gun 10 and therefore allows a lower analysis chamber pressure to be achieved. Of course, gas flow restriction may be provided by a narrow channel or aperture, or by a narrowing insert placed into a channel aperture.

FIG. 8a shows a schematic electron beam trajectory in the electron beam mode of the pulsed combined flood gun 10 of FIGS. 6a and 7, and FIG. 8b shows a schematic ion beam trajectory in the ion beam mode of the pulsed flood gun of FIGS. 6b and 7. Exemplary focusing performance of the various electrodes in the combined flood gun 10 is illustrated by these trajectories, but many other trajectories may be obtained by suitable adjustments to the potentials applied in either of the electron beam or ion beam modes.

As discussed above, with the pulsed mode of the combined flood gun 10, it is possible to apply a large extraction potential to the electron extraction electrode 40. As a result of this, the temperature of the filament 34 of the cathode 32 may be reduced by typically 100° C. This offers the advantage of reducing the thermal energy spread in the electron beam and of improving the energy resolution of sample measurements taken in the analysis chamber.

In selecting the operating potentials for the pulsed mode of the combined flood gun 10, it is possible to optimise those for the electron beam mode and those for the ion beam mode independently. In the ion beam mode, it is preferable for the ionizing electrons to have an energy of between 25 eV and 75 eV, since this provides the most efficient ionization of argon. It is also preferable to apply a negative potential for the extracting lens sub-assembly 60, to provide optimum focusing of the ion beam and also to prevent high-energy electrons from reaching the sample and charging it to an undesirably large negative potential. In the electron beam mode, the energy of the electrons is preferably very low, typically below about 4 eV. Again, the extracting lens sub-assembly 60 should accelerate the electrons (i.e., be positive), since better focusing is achieved under acceleration than under deceleration.

By way of example only, the preferred electrode potentials and other parameters for the embodiments of FIGS. 6a, 6b and 7 (using argon gas) are as follows:

Electron beam mode:
    Cathode 32, $V_1$ ~−4 V
    Electron extraction electrode 40,
    $V_2$ ~+100 V
    Electron focusing lens 44 ~+9 V
    Gas ionization cell 80 ~+20 V
    Extracting lens sub-assembly 60,
    $V_{3,4}$ ~+110 V
    Electron beam of sample ~>20 µA
Ion beam mode:
    Cathode 32, $V_1$ ~4 to −30 V
    Electron extraction electrode 40,
    $V_2$ ~+100 V Electron focusing lens 44 ~+9 V
Gas ionization cell 80 ~+20 V or more, if desired
Extracting lens sub-assembly 60, $V_{3,4}$ ~−300 V
Ion beam at sample ~>20 nA
Analysis chamber pressure: ~<5–7×$10^{-6}$ Pa
Gas ionization zone pressure: ~$10^{-2}$ Pa In the combined flood gun 10 of the present invention, the energy of the electrons reaching the sample S is determined by the cathode potential $V_1$ and the potential $V_s$ of the sample. Similarly, the energy of the ions reaching the sample S is determined by the electric potential existing in the gas ionization zone 50 when the ions are formed and the potential of the sample $V_s$. In both cases, it is the difference between these potentials which determines the energy of the electrons or ions. Any potentials applied to electrodes downstream of the source of electrons or source of ions may accelerate or retard, and focus the electrons or ions as they pass through them, but the final energy of the electrons or ions reaching the sample S is not affected by them. The electron beam current arriving the sample S is determined by the cathode potential $V_1$, the electron extraction electrode potential $V_2$ and by how well focused the beam can be made as it passes through the combined flood 10. It will be understood therefore that there are many parameters which have an affect on the electron beam and these may be adjusted in numerous ways to alter the performance of the combined flood gun. The ion beam current at the sample is affected by the electron beam current and energy passing through the gas ionization zone 50 and also by the gas pressure within the gas ionization zone. Again, there are many parameters which may be varied.

In the simultaneous mode of the combined flood gun 10, it is possible to arrange the electrodes and their potentials, such that both the electron beam and ion beam can be focused to respective flood areas at a sample S. This has the advantage of providing a relatively simple overall combined flood gun design. In the pulsed mode of the combined flood gun 10, it is possible to have complete control over all of the parameters in both the electron beam and ion beam modes. As a result of specifically tailoring the electrode potentials in each mode, it is possible to obtain a higher beam current of electrons or ions at the sample. This provides the option of having a very efficient combined flood gun 10, albeit slightly more complex (in terms of control electronics etc). It will be understood, therefore, that the combined flood gun 10 of the present invention offers the advantages of simplicity on the one hand and performance on the other, depending on the specific arrangement and operation of the gun which is selected.

Although the above embodiments have been described using electrostatic electrodes, any suitable arrangement of electrostatic, electromagnetic, or magnetic charged particle control devices may be employed. Indeed, such devices do not necessarily need to have an aperture through them, but may alternatively comprise sets of parallel or curved plates or coils or the like.

In addition, the geometries of the apertures formed for example through the electron extraction electrode (42), the second extraction electrode (66), the gun (70), the gas ionization cell walls (83, 85) and the restricting aperture (86) may take any desirable form, including circular, slotted, tapered etc.

It will be understood that any of the apparatus features described in relation to one of the simultaneous and pulsed modes of the combined flood gun 10 of the present invention, where practicable and beneficial, may be applied to the embodiments described in relation to the other of those modes.

While the above embodiments describe the production of electrons by means of thermionic emission, the electrons may alternatively be produced by cold field emission, using a sharp metal emitting tip and a large electric field.

Although the specific embodiments above discuss the use of electrons and argon ions as charge neutralising particles, it will be understood that any suitable negatively charged particles may be used instead of electrons, and any suitable positively charged particles may be used instead of argon ions.

Finally, although beneficial in terms of reduced apparatus size and complexity, it is not necessary for the ions supplied in the combined flood gun 10 to be generated by the electron/negative particle beam, as described above. Instead, another ionizing particle beam may be used, or alternatively still, the ions may be generated externally of the gun assembly 20 and then supplied to the gun assembly, for downstream extraction and focusing to a sample. In this case, the gas ionization zone could be termed an ionized gas supply zone.

What is claimed is:

1. A flood gun for charge neutralization of an analysis region of a sample downstream of the flood gun, comprising:
    a first source of electrons;
    a second source of positively charged particles; and
    an extraction and focusing assembly, arranged to:
    (i) extract a first, electron beam from the first source and focus the first beam to a first flood area at the analysis region; and
    (ii) extract a second, positive particle beam from the second source and focus the second beam to a second flood area at the analysis region.

2. The flood gun of claim 1, wherein the source of electrons is a cathode at a first potential and arranged to produce electrons.

3. The flood gun of claim 1, wherein the source of positively charged particles comprises a gas ionization zone and a gas supply port, for receiving a supply of an inert gas within the gas ionization zone, the gas ionization zone being arranged to receive therein a supply of ionizing particles capable of ionizing atoms or molecules of the inert gas.

4. The flood gun of claim 3, wherein the source of electrons is a cathode at a first potential and arranged to produce electrons and the ionizing particles are provided by the electrons produced from the cathode.

5. The flood gun of claim 3, wherein the source of electrons is a cathode at a first potential and arranged to produce electrons and the extraction and focusing assembly comprises a first extraction electrode, located between the cathode and the gas ionization zone and comprising an anode at a second potential which is positive with respect to the first potential such that electrons produced by the cathode are accelerated as an electron beam into the gas ionization zone.

6. The flood gun of claim 3, wherein the extraction and focusing assembly further comprises a second extraction electrode at a third potential, located downstream of the gas ionization zone and arranged to generate from the positive ions formed in the gas ionization zone an ion beam downstream of the gas ionization zone.

7. The flood gun of claim 3, wherein the gas ionization zone is a confinement zone, arranged substantially to confine the gas therein.

8. The flood gun of claim 3, wherein the source of electrons is a cathode at a first potential and arranged to produce electrons and the gas ionization zone comprises an inlet aperture for allowing passage of the electrons into the gas ionization zone, and a downstream outlet aperture for allowing passage of the electron beam and/or the resulting ion beam out of the gas ionization zone.

9. The flood gun of claim 8, wherein the inlet and outlet apertures are sized such that a first gas pressure may be maintained within the gas ionization zone which is greater than a second pressure external of the gas ionization zone.

10. The flood gun of claim 9, further comprising a differential pumping port adapted to be connected to a differential pump for evacuating the flood gun to the second pressure based on a difference between the first gas pressure generated within the gas ionization zone and a relatively lower, third pressure of an analysis chamber in which the flood gun is employed.

11. The flood gun of claim 10, further comprising a gas flow restrictor element, located adjacent and downstream of the gas ionization zone and wherein the differential pumping port is located between the gas ionization zone and the gas flow restrictor element, such that differential pumping efficiency may be increased.

12. The flood gun of claim 1, wherein the extraction and focusing assembly is arranged to extract and focus both the electron beam and the positive particle beam simultaneously.

13. The flood gun of claim 12, wherein
a) the source of electrons is a cathode at a first potential and arranged to produce electrons;
b) the extraction and focusing assembly comprises a first extraction electrode, located between the cathode and the gas ionization zone and comprising an anode at a second potential which is positive with respect to the first potential such that electrons produced by the cathode are accelerated as an electron beam into the gas ionization zone;
c) the extraction and focusing assembly further comprises a second extraction electrode at a third potential, located downstream of the gas ionization zone and arranged to generate from the positive ions formed in the gas ionization zone an ion beam downstream of the gas ionization zone, and
d) the third potential of the second extraction electrode is less positive than the second potential of the first extraction electrode, such that (i) the ions are extracted downstream of the ionization zone, and (ii) a majority of the electrons in the electron beam accelerated by the first extraction electrode have sufficient energy to pass downstream of the second extraction electrode.

14. The flood gun of claim 13, wherein the extraction and focusing assembly further comprises a focusing lens, located downstream of the gas ionization zone and arranged simultaneously to focus the electron beam to the electron flood area while accelerating the electrons and to focus the ion beam to the ion flood area while decelerating the ions.

15. The flood gun of claim 12, wherein potentials applied to respective components of the flood gun are constant values.

16. The flood gun of claim 1, wherein the extraction and focusing assembly is arranged to extract and focus the electron beam and the positive particle beam alternately, in an electron beam mode and an ion beam mode respectively.

17. The flood gun of claim 16, wherein
a) the source of electrons is a cathode at a first potential and arranged to produce electrons;
b) the extraction and focusing assembly comprises a first extraction electrode, located between the cathode and the gas ionization zone and comprising an anode at a second potential which is positive with respect to the first potential such that electrons produced by the cathode are accelerated as an electron beam into the gas ionization zone;
c) the extraction and focusing assembly further comprises a second extraction electrode at a third potential, located downstream of the gas ionization zone and arranged to generate from the positive ions formed in the gas ionization zone an ion beam downstream of the gas ionization zone, and
d) in the electron beam mode, the third potential of the second extraction electrode is positive, such that (i) a majority of the electrons in the electron beam accelerated into the gas ionization zone are extracted downstream of the ionization zone, and (ii) the ions formed in the gas ionization zone are substantially constrained therein.

18. The flood gun of claim 16 wherein
a) the source of electrons is a cathode at a first potential and arranged to produce electrons;
b) the extraction and focusing assembly comprises a first extraction electrode, located between the cathode and the gas ionization zone and comprising an anode at a second potential which is positive with respect to the first potential such that electrons produced by the cathode are accelerated as an electron beam into the gas ionization zone;
c) the extraction and focusing assembly further comprises a second extraction electrode at a third potential, located downstream of the gas ionization zone and arranged to generate from the positive ions formed in the gas ionization zone an ion beam downstream of the gas ionization zone, and
d) in the ion beam mode, the third potential of the second extraction electrode is negative, such that (i) the ions formed in the gas ionization zone are extracted downstream of the ionization zone, and (ii) the electrons accelerated into the gas ionization zone are retarded.

19. The flood gun of claim 18, wherein a field gradient between the gas ionization zone and the second extraction electrode is sufficiently negative that the electrons are substantially constrained in the gas ionization zone.

20. The flood gun of claim 18, further comprising a beam stop, located downstream of the second extraction electrode and arranged to arrest a proportion of the most energetic ions extracted from the second extraction electrode while permitting the remainder to pass thereby.

21. The flood gun of claim 16, further comprising an electron focusing lens, located between the first extraction electrode and the gas ionization zone and arranged to focus the electron beam into the ionization zone.

22. The flood gun of claim 16, wherein the cathode is a low-temperature cathode, such as a lanthanum hexaboride cathode.

23. The flood gun of claim 16, wherein potentials applied to one or more respective components of the flood gun are switched between electron and ion beam modes.

24. The flood gun of claim 1, wherein a first radius of the first flood area is in the range 50 µm to 1 mm and a second radius of the second flood area is in the range 1 mm to 5 mm.

25. A spectroscopic system for secondary particle emission analysis, comprising:
a first source of irradiating primary particles;
the flood gun of claim 1; and a secondary particle analyser.

26. A method of providing charge neutralisation at an analysis region of a sample using a flood gun, the flood gun comprising a first source of electrons and a second source of positively charged particles, the method comprising the steps of:
supplying electrons, and extracting an electron beam, from the first source and focusing the electron beam to a first flood area at the analysis region; and
supplying positively charged particles, and extracting a positive particle beam, from the second source and focusing the positive particle beam to a second flood area at the analysis region.

27. The method of claim 26, wherein the step of supplying positively charged particles comprises generating positive ions within a gas ionization zone, into which is provided a supply of an inert gas and into which an electron beam is arranged to pass and cause ionization of the atoms/molecules of the inert gas.

28. The method of claim 26, wherein the electron beam and the positive particle beam are focused simultaneously.

29. The method of claim 26, wherein the electron beam and the positive particle beam are focused alternately, in a negative beam mode and a positive beam mode respectively.

30. The method of claim 29, wherein the electron beam and the positive particle beam respectively are focused, or extracted and focused, by a focusing lens assembly, a control signal applied to which only is switched to alternate the beam mode.

31. The method of claim 30, wherein a switching period of the flood gun is shorter than a time constant of the analysis region of the sample.

32. The method of claim 30, wherein a switching frequency of the flood gun is in the range 10 kHz and 1 MHz.

33. The method of claim 29, wherein the electron beam and the positive particle beam respectively are focused, or extracted and focused, by a focusing lens assembly, a control signal applied to which at least is switched to alternate the beam mode.

34. The method of claim 33, wherein a switching period of the flood gun is shorter than a time constant of the analysis region of the sample.

35. The method of claim 33, wherein a switching frequency of the flood gun is in the range 10 kHz and 1 MHz.

36. The method of claim 29, wherein the beam modes are alternated by means of an electrical potential switching waveform, a duty cycle of which may be varied to adjust a ratio of electron beam current to positive particle beam current reaching the analysis region.

* * * * *